United States Patent
Gernhoefer et al.

(10) Patent No.: US 7,568,173 B2
(45) Date of Patent: Jul. 28, 2009

(54) INDEPENDENT MIGRATION OF HIERARCHICAL DESIGNS WITH METHODS OF FINDING AND FIXING OPENS DURING MIGRATION

(75) Inventors: Veit Gernhoefer, Holzgerlingen (DE); Matthew T. Guzowski, Essex Junction, VT (US); Jason D. Hibbeler, Williston, VT (US); Kevin W. McCullen, Essex Junction, VT (US); Rani Narayan, San Jose, CA (US); Stephen L. Runyon, Pflugerville, TX (US); Leon J. Sigal, Monsey, NY (US); Robert F. Walker, St. George, VT (US); Pieter J. Woeltgens, Yorktown Heights, NY (US); Xiaoyun K. Wu, Hopewell Junction, NY (US); Xin Yuan, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 11/762,832

(22) Filed: Jun. 14, 2007

(65) Prior Publication Data

US 2008/0313581 A1    Dec. 18, 2008

(51) Int. Cl.
*G06F 17/50*    (2006.01)
(52) U.S. Cl. .................... 716/3; 716/4; 716/18
(58) Field of Classification Search .............. None
See application file for complete search history.

(56) References Cited

U.S. PATENT DOCUMENTS

| 6,189,132 | B1 | 2/2001 | Heng et al. |
| 6,986,109 | B2 | 1/2006 | Allen et al. |
| 7,363,601 | B2 * | 4/2008 | Heng et al. ........... 716/3 |

* cited by examiner

*Primary Examiner*—Leigh Marie Garbowski
(74) *Attorney, Agent, or Firm*—Ryan K. Simmons; Hoffman Warnick LLC

(57) ABSTRACT

Methods of independently migrating a hierarchical design are disclosed. A method for migrating a macro in an integrated circuit comprises: determining an interface strategy between a base cell in the macro and the macro, the base cell including an interface element involved in the interface strategy; migrating the base cell independently with respect to the macro based on the interface strategy; initially scaling the macro; swapping the migrated base cell into the macro; and legalizing content of the initially scaled macro.

12 Claims, 6 Drawing Sheets

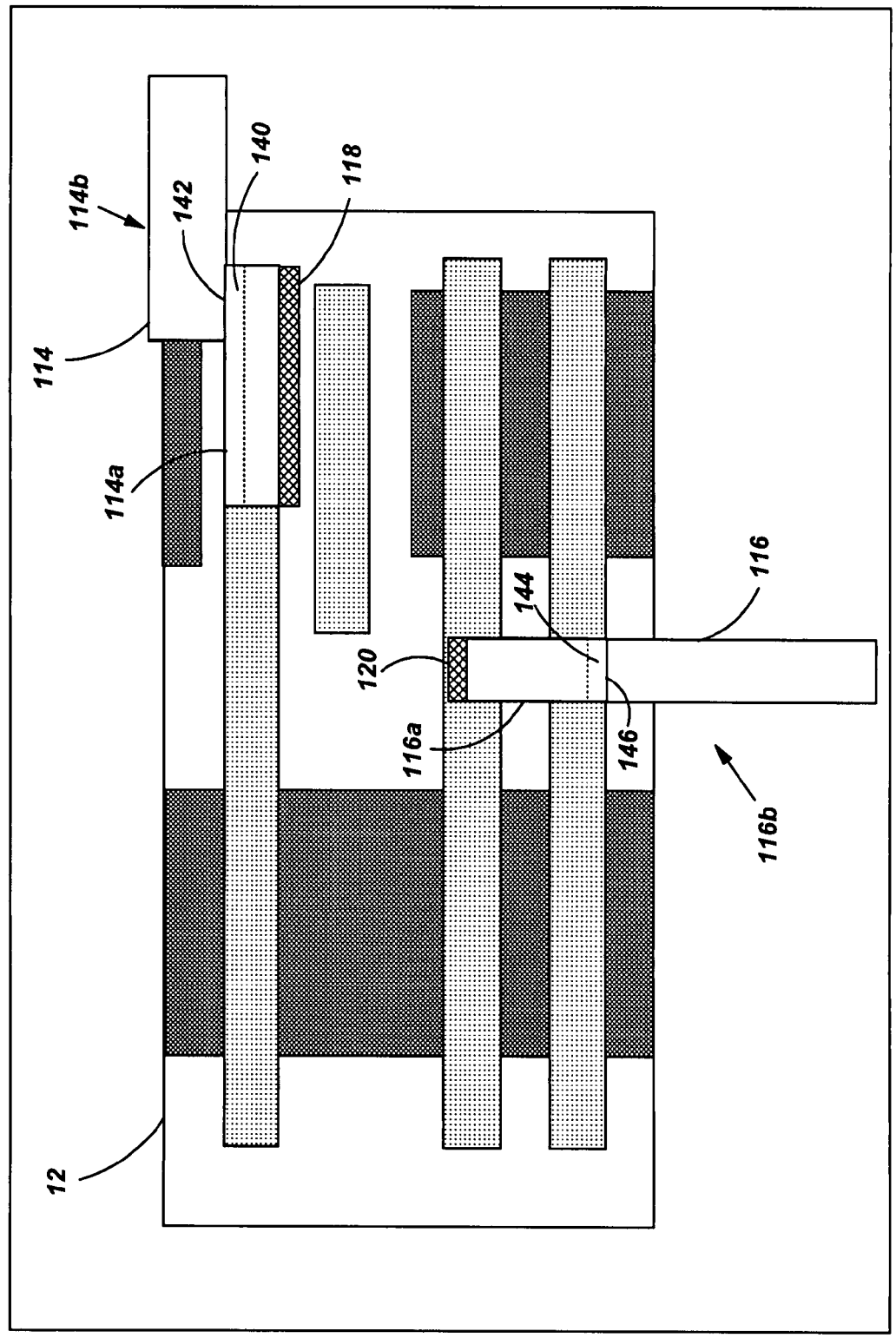

INDEPENDENT MIGRATION OF HIERARCHICAL DESIGNS WITH METHODS OF FINDING AND FIXING OPENS DURING MIGRATION

BACKGROUND

1. Technical Field

The disclosure relates generally to integrated circuit (IC) chip, and more particularly, to IC design migration.

2. Background Art

Technology remapping requires scaling of IC layouts. Typically, the scaling of an IC design is not uniform for all ground rules. To solve this issue, conventional approaches use an optimizer to scale all components of an IC layout and then use another optimizer to fix up potential ground-rule errors. Constraints may be applied to perform the scaling in a non-uniform fashion.

An IC layout with macros built from a common cell library presents a special difficulty because the macros are customized and the base cells are standardized. Here, a macro is made up of circuit rows, each circuit row including library cells abutting one another. One conventional approach to the macro migration issue puts all macros to be migrated in a single super-cell to process. Under this approach, all sub-cells are migrated simultaneously with the respective top-level cell, and all top-level cells are migrated simultaneously and in relation to one another. Here, a sub-cell and a top-level cell are defined with respect to the hierarchical structure of an IC design. Such an approach would be expensive from the perspective of time and data volume. In addition, it might not be known which top-level cells need to be migrated ahead of time, which makes this approach difficult unsuitable.

Another approach to the macro migration issue migrates top-level cells and sub-cells separately. Top-level cells are re-assembled using the migrated versions of the data in the macros and the migrated versions of the sub-cells. One drawback of this approach is the fact that the environments of the top level cells are not known when the sub-cells are migrated, and vice versa. A further drawback is that electrical shorts or opens can result between shape in a sub-cell and shapes in a macro. In this case, a large amount of manual fix-up may be required to rebuild the top-level cell.

SUMMARY

A first aspect of the disclosure provides a method for migrating a macro in an integrated circuit, the method comprising: determining an interface strategy between a base cell in the macro and the macro, the base cell including an interface element involved in the interface strategy; migrating the base cell independently with respect to the macro based on the interface strategy; initially scaling the macro; swapping the migrated base cell into the macro; and legalizing content of the initially scaled macro.

A second aspect of the disclosure provides a method of determining a relative position between an updated version of a macro level shape and an updated version of a cell level shape, the macro level shape and the cell level shape abutting one another in an original integrated circuit layout, the method comprising: creating a union shape based on the cell level shape and the macro level shape in the original integrated circuit layout; updating the union shape in a same manner as the macro level shape is updated; and comparing the updated union shape with the updated version of the cell level shape and the updated version of the macro level shape to determine the relative position.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 3-6 show the operation of the method of FIG. 2 on an illustrative example of a base cell in a macro.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
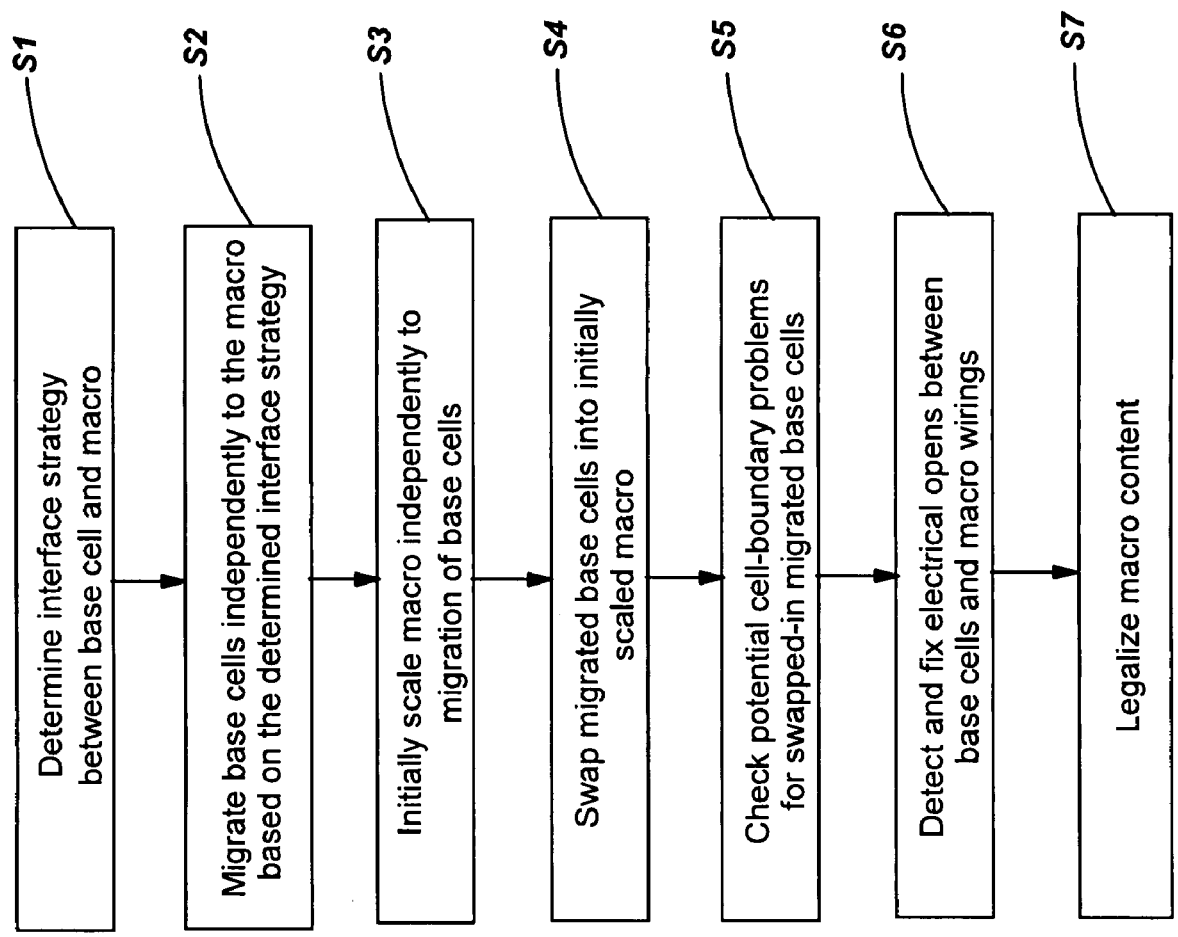
FIG. 1 shows a flow diagram of a method of independently migrating a macro and a base cell in the macro.

Referring to the drawings, FIG. 1 shows embodiments of a method of migrating an integrated circuit (IC) layout including macros. In process S1, an interface strategy between base cells and the respective macro is determined. An interface strategy may include any interface criteria. For example, a wire that connects base cells within the macro (referred to herein as a macro wiring) may need to connect a base cell only at a specific pin of the base cell. For another example, all base cells in a macro may need to include a certain blockage structure to accommodate macro wiring. For example, base cells may need to leave certain tracks open for use by macro wiring. According to an embodiment, the base cell elements that are required to obey the determined interface criteria, e.g., the above-mentioned connection pins and blockage structures, need to remain in the same relative locations after migration, i.e., they need to be scaled uniformly with respect to the respective cell boundaries. Such elements are referred to herein as "interface elements".

In process S2, the base cells are migrated independently with respect to the macro based on the determined interface strategy. Any method may be used in the migration and all are included. For example, the known optimization driven scale-then-legalize process flow may be used in the independent migration of the base cells. In the migration, the interface criteria established in process S1 need to be obeyed. The migration may include scaling and fixing ground-rule errors. Since the ground rules do not scale uniformly and there are artificial constraints imposed by the boundary conditions or the interface criteria determined in process S1, it is necessary to adjust shapes after the scaling. In addition, the scaling itself may be different from simple geometric scaling—it may be scaling using an optimizer. The scale-then-legalize technique was disclosed in U.S. Pat. No. 6,986,109 to Allen et al., and/or U.S. Pat. No. 6,189,132 to Heng et al.

In process S3, the macro is initially scaled independently with respect to the migration of the base cells. That is, the base cells contained in the macro are not involved in the initial scaling of the macro. As such, in the description, macro content includes all shapes in the macro except base cells. For example, the optimization driven scale-then-legalize process flow may be used in the initial scaling of the macro. In addition, restraints may be applied to prevent opens and shorts. For example, constraints to prevent opens and shorts require that if two shapes on the same layer touch in the original layout, then they must touch in the initially scaled layout, and if two shapes on the same layer do not touch in the original layout, they must not touch in the initially scaled layout. The scaling is "initial" to the extent that the scaled macro will be further processed to finish the migration of the macro as described herein. According to an embodiment, the legalization in the initial scaling only involves macro content, but does not involve base cells.

In process S4, the migrated base cells are swapped into the initially scaled macro using any now known or later developed cell swap method. For parameterized cells, the parameters may need to be scaled in each placement of the cell as the migrated version is swapped in.

In process S5, optionally, potential cell-boundary problems are checked for the swapped-in migrated base cells. For example, the aspect ratios of each migrated base cell should remain unchanged.

Figure 2:
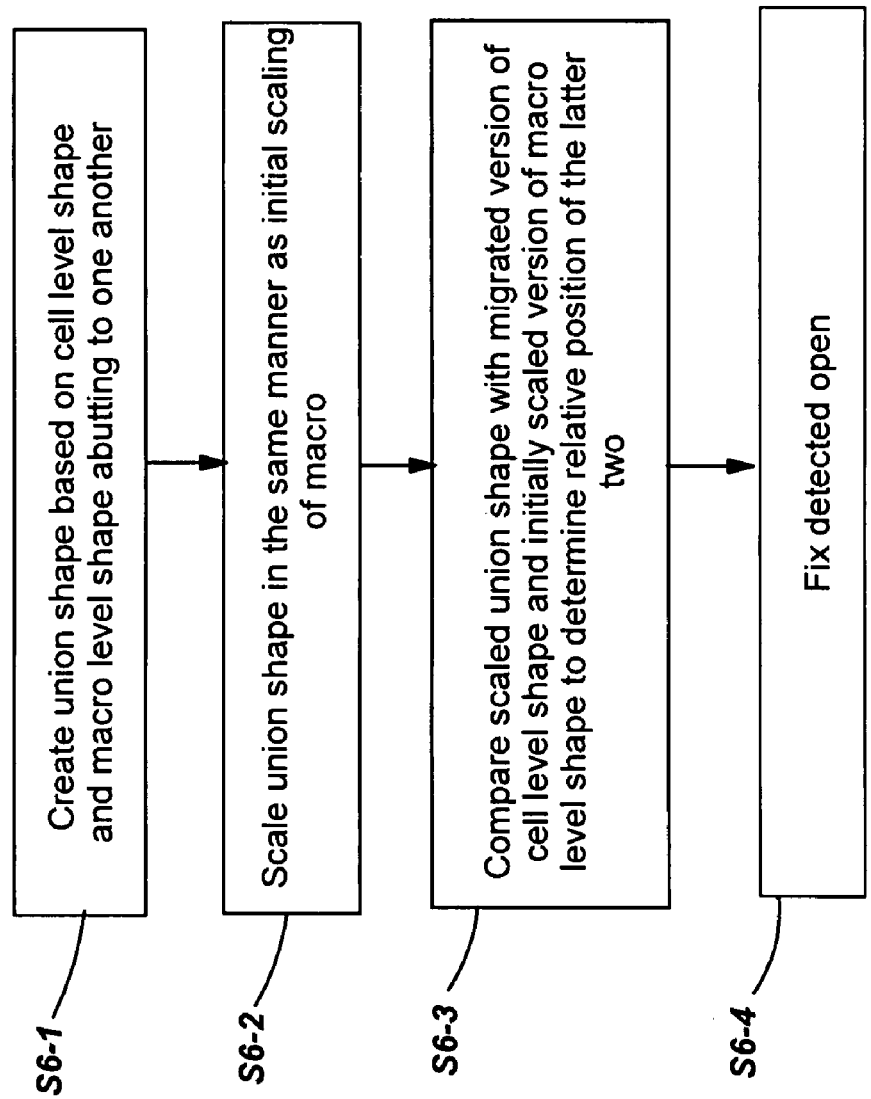
FIG. 2 shows a flow diagram of a method of detecting and fixing an open.
Figure 3:
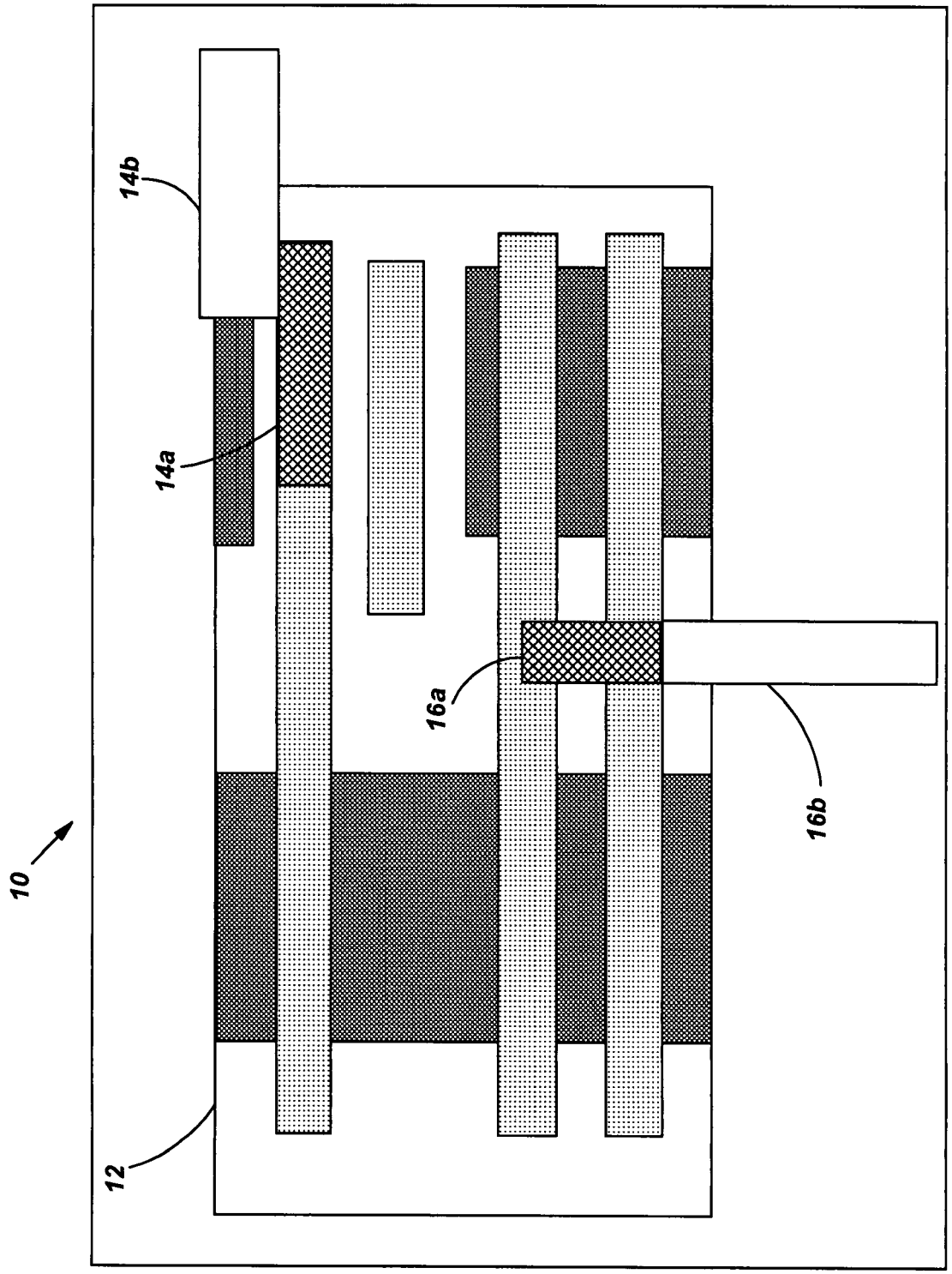

In process S6, electrical opens between base cells and macro wiring are detected and fixed. In some cases there are connections from base cells to macro that do not adhere to the interface strategy determined in process S1. For example, abutment across a hierarchical boundary can lead to a situation in which previously touching shapes do not touch one another after the migration of the base cells and the initial scaling of the macro. When two shapes do not touch, the legalization process (as will be described herein) will treat the shapes as distinct electrical shapes and will attempt to pull them apart to the minimum spacing required by the ground rules. Process S6 detects and fixes these conditions before the legalization process S7 described herein. FIG. 2 shows an embodiment of the detecting and fixing procedure of S6, and FIGS. 3-6 illustrate the operation of the method of FIG. 2 with respect to an exemplary base cell 12 in macro 10. Referring to FIG. 2, in process S6-1, a union shape is created based on a cell level shape and a macro level shape abutting one another in an original IC layout. FIG. 3 schematically shows a base cell 12 in macro 10 of an original IC layout, i.e., before a migration is implemented. Cell level shape 14a in base cell 12 touches/is connected to macro level shape 14b, and cell level shape 16a touches/is connected to macro level shape 16b. A cell level shape refers to a shape within a base cell and migrated with the base cell; and a macro level shape refers to a shape within a macro, which is not within a base cell and is initially scaled with the macro. The connected cell level shape, e.g., 14a, and the macro level shape, e.g., 14b, are referred to herein as pair shapes for illustrative purposes. As such, shapes 14a and 14b are pair shapes and shapes 16a and 16b are pair shapes. It should be appreciated that the specific shapes shown in FIG. 3 are for illustrative purposes, and do not limit the scope of the disclosure.

Figure 4:
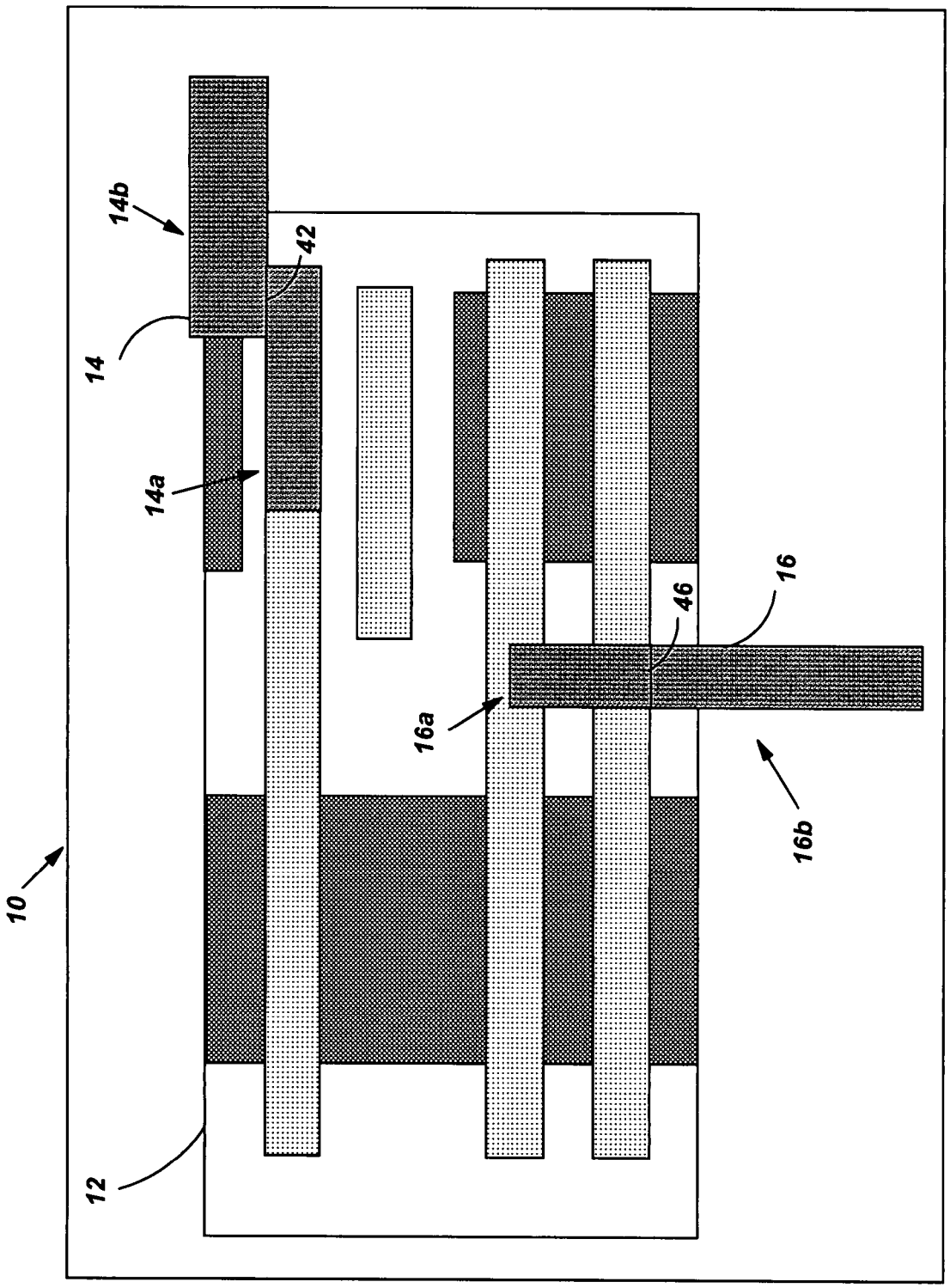

Referring to FIG. 4, a union shape is created based on the pair shapes. For example, union shape 14 is created based on pair shapes 14a and 14b. As shown in FIG. 4, the image of cell level shape 14a is combined with the image of macro level shape 14b to create union shape 14. It is not necessary that the whole shape of a macro level shape, e.g., 14b, or the respective cell level shape, e.g., 14a, are included in the union shape. Only portions of the pair shapes need to be included provided that the portions can represent their connection/abutment. Also required is that the two portions are large enough to show the relative relationship of the respective pair shapes after the migration of base cell 12 and the initial scaling of macro 10, e.g., after potential separation of the migrated/scaled versions of the pair shapes, the migrated/scaled versions of the pair shapes can still be taken as related to one another. As shown in FIG. 4, union shapes 14 and 16 are created based on shape pairs 14a and 14b and shape pairs 16a and 16b, respectively. In the created union shapes 14, 16, lines 42 and 46 are identified to represent the interfaces between the original cell level shapes 14a, 16a, and macro-level shapes 14b, 16b, respectively.

Referring back to FIG. 2, in process S6-2, the union shapes, e.g., 14, are scaled in the same manner as the initial scaling of macro 10, i.e., scaled uniformly with respect to macro 10. FIG. 6 shows a scaled union shape 114 from union shape 14 (FIG. 4) and a scaled union shape 116 from union shape 16 (FIG. 4).

Referring back to FIG. 2, in process S6-3, the scaled union shape, e.g., 114, is compared with the migrated version of the respective cell level shape 14a (FIG. 3) and the initially scaled version of the respective macro level shape 14b (FIG. 3) to determine a relative position of the latter two, e.g., whether an open exists between shapes 114a and 114b. According to an embodiment, the migrated version and initially scaled version of the shape pairs are obtained through processes S1-S5 of FIG. 1.

Figure 5:
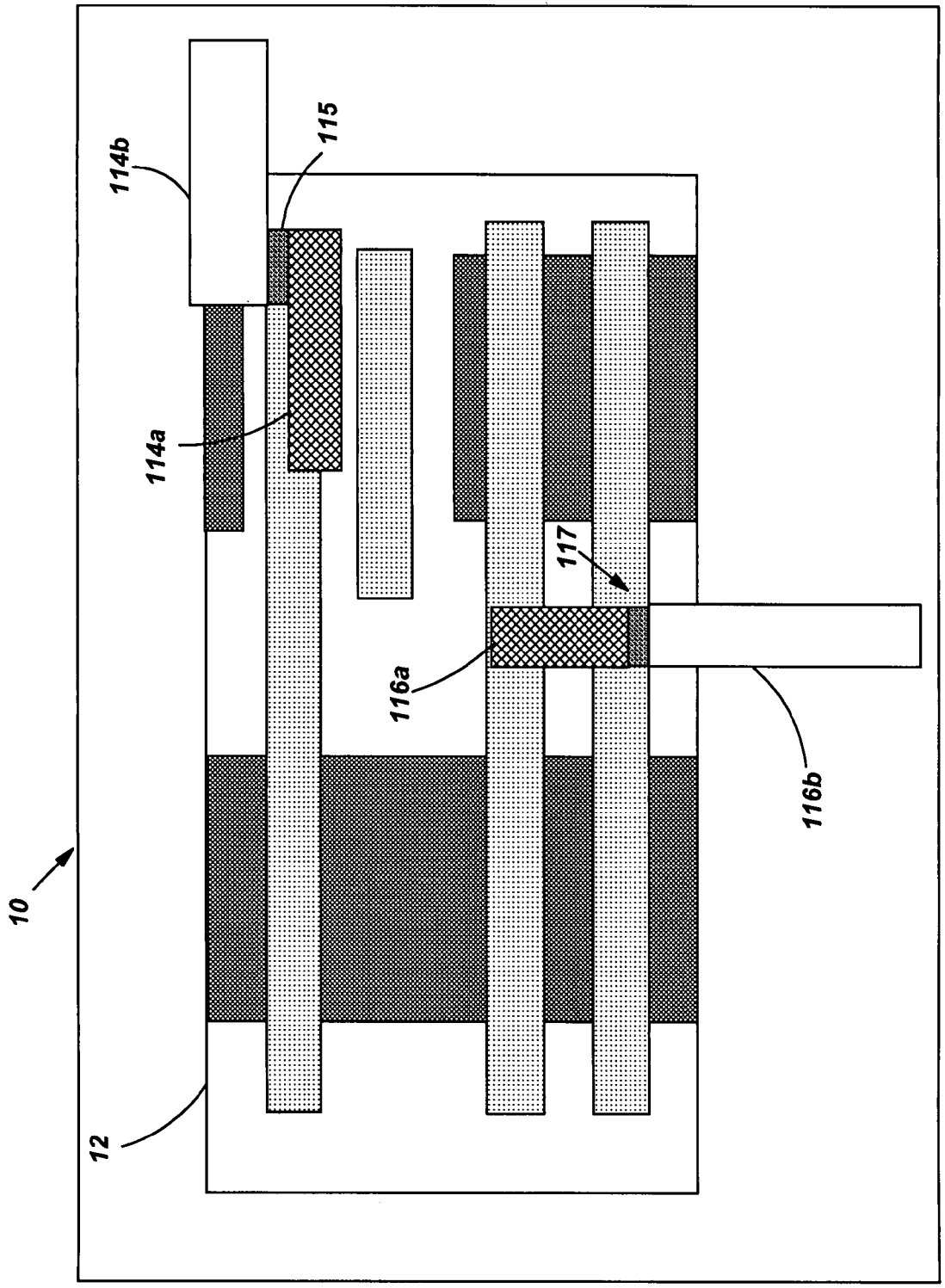

FIG. 5 shows migrated base cell 12 swapped into initially scaled macro 10 following processes S1-S5. As shown in FIG. 5, cell level shape 14a (FIG. 3) is migrated into migrated version 114a and cell level shape 16a (FIG. 3) is migrated into migrated version 116a. Macro level shape 14b (FIG. 3) is initially scaled into initially scaled version 114b and macro level shape 16b (FIG. 3) is initially scaled into initially scaled version 116b. For illustrative purposes, FIG. 5 shows an open 115 between shapes 114a and 114b and an open 117 between shapes 116a and 116b. The opens 115, 117 need to be detected in process S6, specifically S6-3.

According to an embodiment, in S6-3, the scaled union shape, e.g., 114, is superimposed onto the migrated version of the respective cell level shape, e.g., 14a (FIG. 3), and the initially scaled version of the macro level shape, e.g., 14b (FIG. 3), to implement the comparison. FIG. 6 shows an illustrative example of the superimposition. As shown in FIG. 6, after the scaled union shape 114 is superimposed onto the respective migrated version 114a and initially scaled version 114b, a difference between the scaled union shape 114 and the combination of shapes 114a and 114b can be detected. Specifically, if migrated version 114a and initially scaled version 114b (shown in Phantom) are subtracted from scaled union shape 114, a portion 140 of scaled union shape 114 remains in proximity to line 142 of scaled union shape 114 which represents a scaled version of interface 42 between cell level shape 14a and macro level shape 14b (FIG. 4). As such, it is determined that open 115 (FIG. 5) exists between migrated version 114a and initially scaled version 114b. Similarly, scaled union shape 116 is superimposed onto respective migrated cell level shape 116a and initially scaled macro level shape 116b and a portion 144 of scaled union shape 116 remains in proximity to line 146 of scaled union shape 116 which represents a scaled version of interface 46 between cell level shape 16a and macro level shape 16b (FIG. 4). As such, it is determined that an open 117 (FIG. 5) exists between migrated version 116a and initially scaled version 116b.

Referring back to FIGS. 2, 5 and 6, in process S6-4, the detected opens are fixed. Different fixing methods may be used for different situations of opens and all are included in the disclosure. According to an embodiment, two methods, optimization of the macro level shape and patching, are used in fixing opens. Specifically, for an open that can be fixed by optimization of the respective initially scaled macro level shape, e.g., open 117 can be fixed by extending initially scaled macro level shape 116b, such an optimization is implemented. Patching can be used for all opens, preferably opens that cannot be fixed by optimization of macro level shapes. For example, open 115 cannot be fixed by optimization of initially scaled macro level shape 114b such that a patch may be applied to open 115 to connect migrated cell level shape 114a and initially scaled macro level shape 114b (FIG. 6).

Referring back to FIG. 1, in process S7, macro content is legalized using any legalization methods. According to an embodiment, in the legalization of macro content, the migrated base cells remain unchanged.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The disclosure further provides various alternative embodiments. For example, in an embodiment, the invention provides a program product stored on a computer-readable medium, which when executed, enables a computer infrastructure to implement the processes described above. To this extent, the computer-readable medium includes program code, which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory and/or other storage system, and/or as a data signal traveling over a network (e.g., during a wired/wireless electronic distribution of the program product).

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method for migrating a macro in an integrated circuit, the method comprising:
   determining, using a computer, an interface strategy between a base cell in the macro and the macro, the base cell including an interface element involved in the interface strategy;
   migrating the base cell independently with respect to the macro based on the interface strategy;
   initially scaling the macro;
   swapping the migrated base cell into the macro
   legalizing content of the initially scaled macro; and
   outputting a schematic of the scaled macro.

2. The method of claim 1, wherein in the migrating, the interface element is scaled uniformly with respect to a cell boundary of the base cell.

3. The method of claim 2, wherein the interface element includes at least one of a pin required to be connected to a macro wiring of the macro and a blockage structure required to accommodate a macro wiring.

4. The method of claim 1, wherein in the swapping, the content of the initially scaled macro remains unchanged.

5. The method of claim 1, wherein in the legalizing, the migrated base cell remains unchanged.

6. The method of claim 1, for a cell level shape of the base cell that abuts a macro level shape of the macro, further comprising detecting whether an open exists between a migrated version of the cell level shape and an initially scaled version of the macro level shape.

7. The method of claim 6, wherein the detecting includes:
   creating a union shape based on the cell level shape and the macro level shape;
   scaling the union shape uniformly with respect to the initial scaling of the macro; and
   comparing the scaled union shape with the migrated version of the cell level shape and the initially scaled version of the macro level shape to, determine an open.

8. The method of claim 7, wherein the comparing includes superimposing the scaled union shape onto the migrated version of the cell level shape and the initially scaled version of the macro level shape.

9. The method of claim 7, further comprising fixing a detected open before the legalizing.

10. The method of claim 9, wherein the fixing is implemented by at least one of: an optimization of the scaled version of the macro level shape and a patching on the detected open.

11. A method of determining a relative position between an updated version of a macro level shape and an updated version of a cell level shape wherein the updated version of a macro level shape has been scaled, the macro level shape and the cell level shape abutting one another in an original integrated circuit layout, the method comprising:
   creating, using a computer, a union shape based on the cell level shape and the macro level shape in the original integrated circuit layout;
   updating the union shape in a same manner as the macro level shape is updated
   comparing the updated union shape with the updated version of the cell level shape and the updated version of the macro level shape to determine the relative position; and
   outputting a schematic of the updated version of the macro level shape.

12. The method of claim 11, wherein the comparing includes superimposing the updated union shape onto the updated version of the cell level shape and the updated version of the macro level shape.

* * * * *